United States Patent
Lee

(10) Patent No.: US 7,838,910 B2
(45) Date of Patent: Nov. 23, 2010

(54) MEMORY DEVICES INCLUDING SPACERS OF DIFFERENT MATERIALS

(75) Inventor: Seung-Jun Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 258 days.

(21) Appl. No.: 11/616,402

(22) Filed: Dec. 27, 2006

(65) Prior Publication Data

US 2008/0099792 A1 May 1, 2008

(30) Foreign Application Priority Data

Oct. 20, 2006 (KR) ..................... 10-2006-0102564

(51) Int. Cl.
*H01L 29/788* (2006.01)

(52) U.S. Cl. .............................. 257/225; 257/E21.209

(58) Field of Classification Search ................. 257/225, 257/E21.209
See application file for complete search history.

(56) References Cited

U.S. PATENT DOCUMENTS

| | | | | |
|---|---|---|---|---|
| 6,605,840 B1* | 8/2003 | Wu | ............................ | 257/315 |
| 2005/0051852 A1* | 3/2005 | Kim et al. | ................... | 257/382 |
| 2006/0038218 A1* | 2/2006 | Yaegashi et al. | ............ | 257/314 |

FOREIGN PATENT DOCUMENTS

| | | |
|---|---|---|
| JP | 2003-197779 | 7/2003 |
| KR | 1020020059934 A | 7/2002 |
| KR | 1020020084473 A | 11/2002 |
| KR | 1020040028384 A | 4/2004 |
| KR | 100505455 B1 | 7/2005 |
| KR | 1020060019074 A | 3/2006 |

* cited by examiner

*Primary Examiner*—Thao X Le
*Assistant Examiner*—Tanika Warrior
(74) *Attorney, Agent, or Firm*—Myers Bigel Sibley & Sajovec, P.A.

(57) ABSTRACT

Memory devices include a semiconductor substrate and a plurality of wordlines on the semiconductor substrate. A ground select line is on the semiconductor substrate on a first side of the wordlines and a string select line is on the semiconductor substrate on a second side of the wordlines. The wordlines extend between the ground select line and the string select line. First spacers are disposed between the wordlines, between the ground select line and an adjacent one of the wordlines and between the string select line and an adjacent one of the wordlines. Second spacers are disposed on sidewalls of the ground select line and the string select line displaced from the first spacers. The second spacers are a different material than the first spacers. The memory devices may be nonvolatile memory devices. Methods are also provided for forming the memory devices.

16 Claims, 13 Drawing Sheets

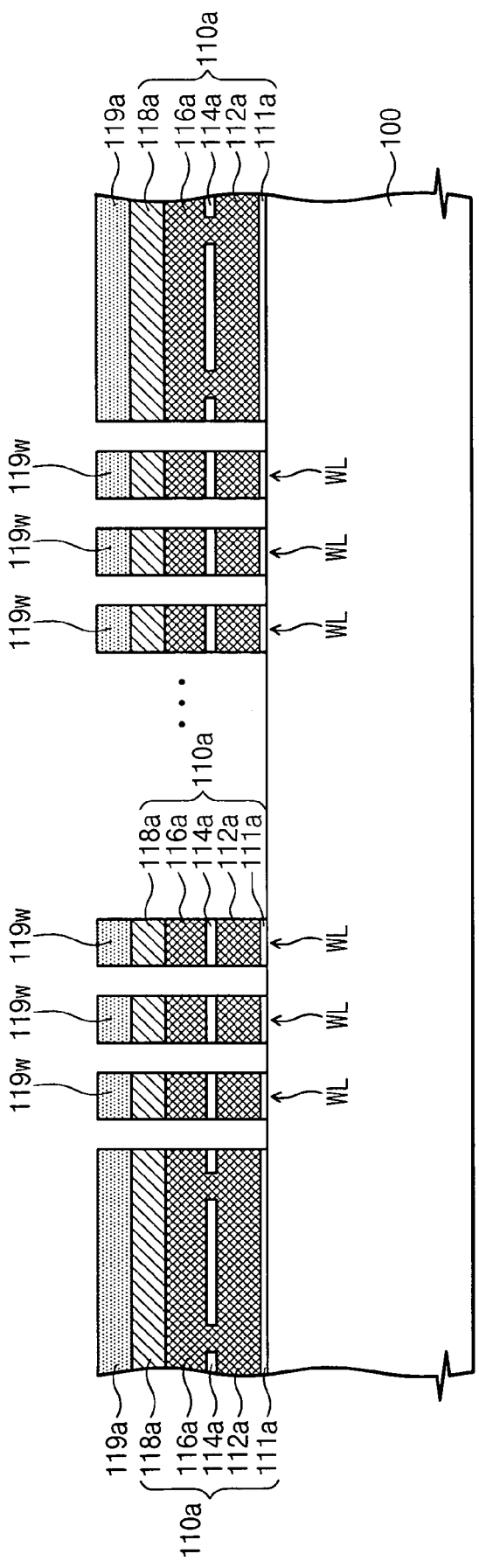

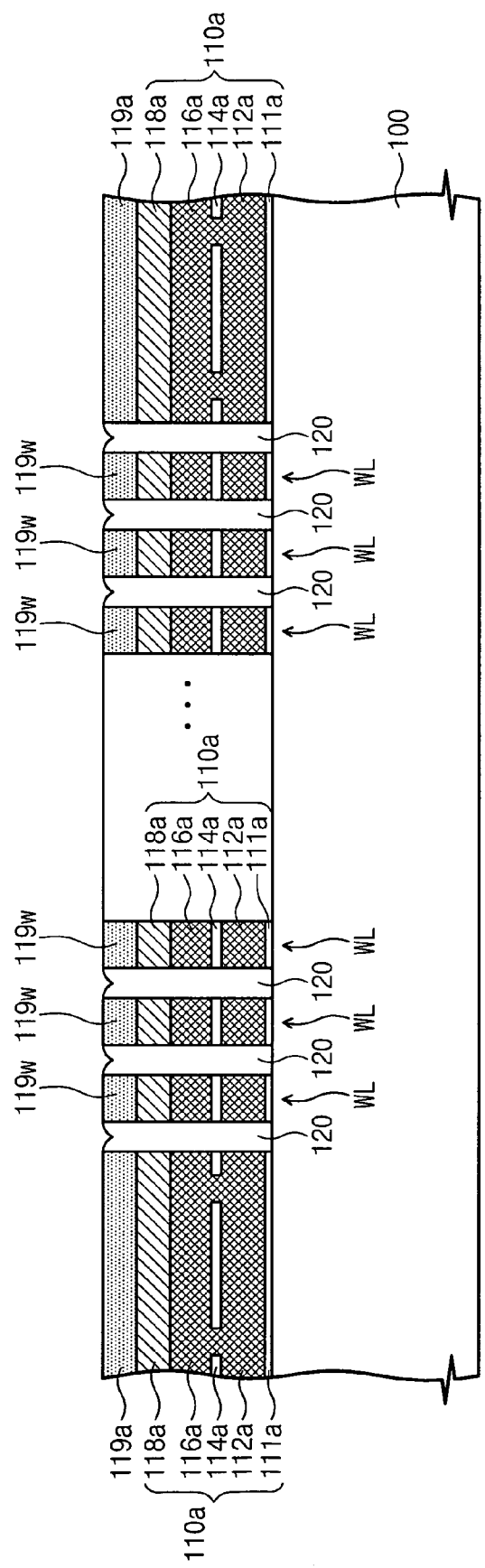

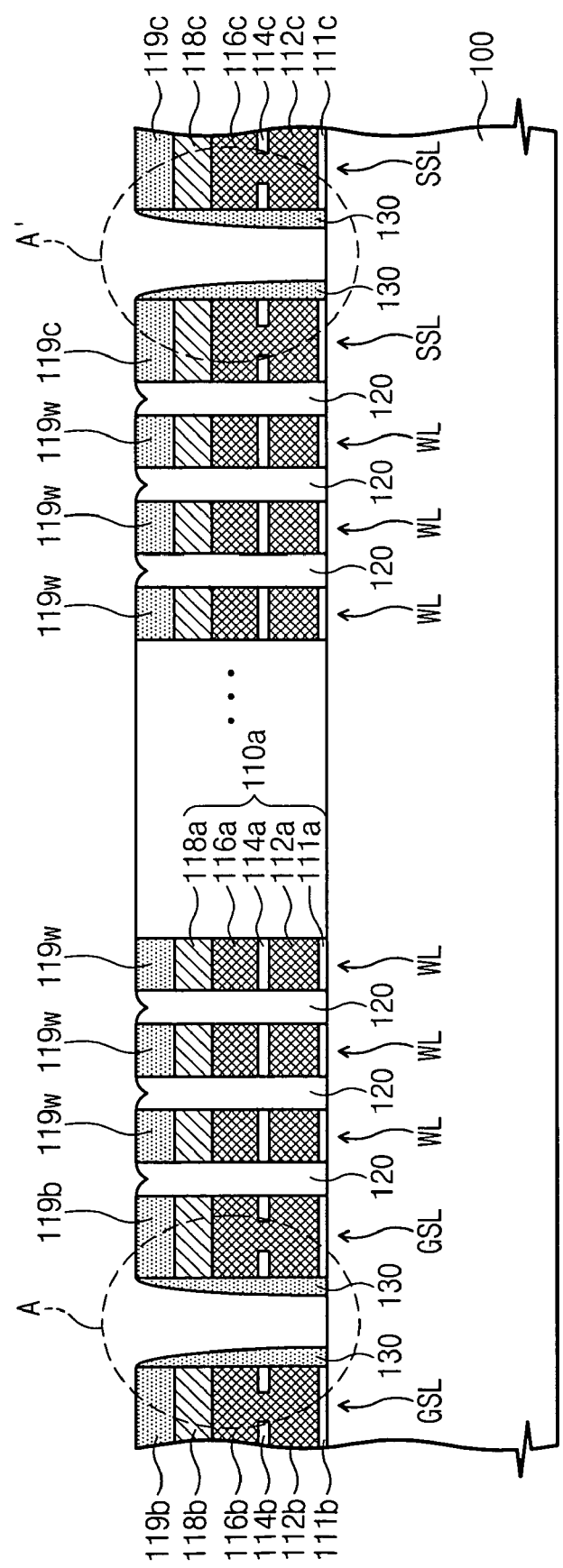

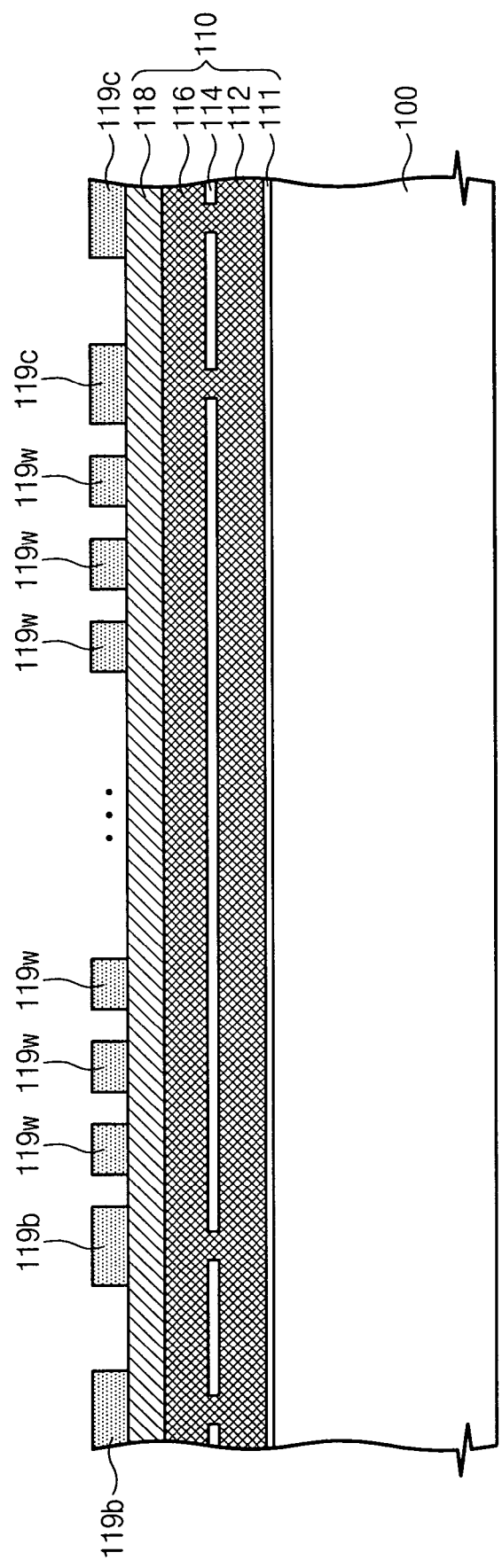

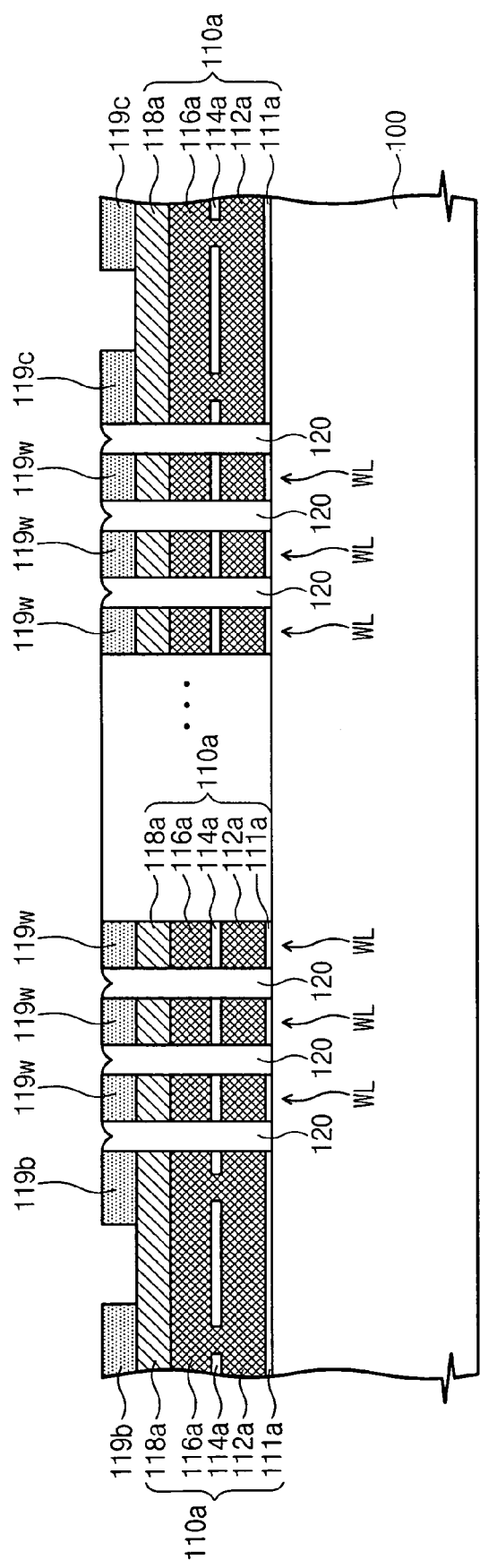

MEMORY DEVICES INCLUDING SPACERS OF DIFFERENT MATERIALS

CROSS-REFERENCE TO RELATED APPLICATION

This application is related to and claims priority under 35 USC §119 from Korean Patent Application No. 10-2006-102564, filed on Oct. 20, 2006 in the Korean Intellectual Property Office, the disclosure of which is incorporated herein by reference in its entirety.

BACKGROUND OF THE INVENTION

The present invention relates to integrated circuit (semiconductor) devices and methods of forming the same, and more particularly, to a nonvolatile integrated circuit devices and methods of forming the same In general, semiconductor memory devices may be classified into volatile memory devices and nonvolatile memory devices. Volatile memory devices need a power to be supplied to retain data, while nonvolatile memory devices can retain data without power being supplied. A flash memory device is a type of highly-integrated nonvolatile memory device that is designed to have beneficial characteristics similar to those provide both by an erasable programmable read only memory (EPROM) and by an electrically erasable programmable read only memory (EEPROM).

Flash memory devices can be classified into a NOR-type flash memory device and a NAND-type flash memory device. The NAND-type flash memory device may be advantageous for providing high integration because a plurality of cells can be united into a single string and, thus, can be controlled in a united fashion. The NAND-type flash memory device generally includes ground select lines arranged on one side of wordlines and string select lines arranged on the other side of the wordlines. In general, spacers containing the same material are disposed between the wordlines and on the sidewalls of the string select lines and the ground select lines.

If the spacers are formed of a silicon nitride layer, a charge trap site is generally formed between the wordlines. As such, the interference between the wordlines may increase due to the high permittivity of the silicon nitride layer. If the spacers are formed of a silicon oxide layer, it may be difficult to scale down the intervals (reduce the spacing) of the ground select lines and the string select lines. The reason for this is that an electrical short may occur when a common source line and a bitline contact are formed between the ground select lines and between the string select lines.

SUMMARY OF THE INVENTION

Embodiments of the present invention provide memory devices including a semiconductor substrate and a plurality of wordlines on the semiconductor substrate. A ground select line is on the semiconductor substrate on a first side of the wordlines and a string select line is on the semiconductor substrate on a second side of the wordlines. The wordlines extend between the ground select line and the string select line. First spacers are disposed between the wordlines, between the ground select line and an adjacent one of the wordlines and between the string select line and an adjacent one of the wordlines. Second spacers are disposed on sidewalls of the ground select line and the string select line displaced from the first spacers. The second spacers are a different material than the first spacers.

In other embodiments, the memory device is a nonvolatile memory device. The devices include at least a pair of ground select line and at least a pair of string select lines. The second spacers are disposed on facing sidewalls between the ground select lines and the string select lines, respectively. The first spacers may have a lower dielectric permittivity than the second spacers. The first spacers may be substantially free of nitrogen. The first spacers may be a silicon oxide layer and the second spacers may be a silicon nitride layer. The second spacers may have a lower etch selectivity than an oxide layer.

In further embodiments, the ground selects lines and the string select lines each include a hard mask pattern in a top layer thereof. The hard mask pattern may have a lower etch selectivity than an oxide layer. The second spacers and the hard mask pattern may be a nitride layer.

In other embodiments, the memory devices further include a common source line and a bitline contact. The common source line contacts the second spacers between the ground select lines. The bitline contact contacts the second spacers between the string select lines. The common source line and the bitline contact are self-aligned between the hard mask patterns.

In further embodiments, a re-oxidation layer is provided on the ground select lines and the string select lines. A pad oxide layer is provided on the re-oxidation layer. The re-oxidation layer and the pad oxide layer are interposed between the second spacers and the ground select lines and between the second spacers and the string select lines, respectively. The ground select lines, the string select lines and/or the wordlines may include a tunnel insulating layer on the semiconductor substrate, a charge storing layer on the tunnel insulating layer, an interlayer insulating layer on the charge storing layer and a gate conductive layer on the interlayer insulating layer.

In yet other embodiments, methods of fabricating a memory device include forming a plurality of wordlines on a semiconductor substrate. A ground select line is formed on a first side of the wordlines. A string select line is formed on a second side of the wordlines. The wordlines extend between the ground select line and the string select line. First spacers are formed between the wordlines, between the ground select line and an adjacent one of the wordlines and between the string select line and an adjacent one of the wordlines. Second spacers are formed on sidewalls of the ground select line and the string select line displaced from the first spacers. The second spacers are formed from a different material than the first spacers.

In some embodiments, the memory device is a nonvolatile memory device and forming a ground select line includes forming at least a pair of ground select lines and forming a string select line includes forming at least a pair of string select lines. Forming the second spacers includes forming the second spacers on facing sidewalls between the ground select lines and the string select lines, respectively. Forming the word lines may include an etching process and forming the first spacers may be preceded by performing a re-oxidation process on the wordlines following the etching process.

In further embodiments, forming the second spacers includes forming a silicon nitride layer between the ground select lines and between the string select lines and anisotropically etching the silicon nitride layer. Torming the second spacers may be preceded by forming a re-oxidized layer on the ground select lines and the string select lines using a re-oxidation process and forming a pad oxide layer on the re-oxidized layer.

In other embodiments, the methods further include forming a common source line contacting the second spacers between the ground select lines and forming a bitline contact contacting the second spacers between the string select lines. The ground select lines and the string select lines may each include a hard mask pattern in a top layer thereof and the common source line and the bitline contact may be formed self-aligned between the hard mask patterns.

In further embodiments, forming the wordlines includes forming a gate layer on the semiconductor substrate. Hard mask patterns are formed on the gate layer to define regions for the wordlines, the ground select lines and the string select lines. A photoresist pattern is formed to expose the region for the wordlines. Gate patterns are formed using an etching process on the gate layer. Forming the wordlines may be followed by performing a re-oxidation process on the wordlines.

In other embodiments, forming the ground select lines and forming the string select lines includes forming a photoresist pattern that exposes the regions for the ground select lines and the string select lines and not the region for the wordlines and then performing an etching process on the gate patterns. Forming the second spacers may include forming a silicon nitride layer between the ground select lines and between the string select lines and anisotropically etching the silicon nitride layer.

In yet further embodiments, forming the second spacers is preceded by forming a re-oxidized layer using a re-oxidation process on the ground select lines and the string select lines and forming a pad oxide layer on the re-oxidized layer. The methods may further include forming a common source line contacting the second spacers between the ground select lines and forming a bitline contact contacting the second spacers between the string select lines. Forming the common source line may include forming the common source line self-aligned between the hard mask patterns in a top layer of the ground select lines. Forming the bitline contact may include forming the bitline contact self-aligned between the hard mask patterns in a top layer of the string select lines.

In other embodiments, forming the gate layer includes forming a tunnel insulating layer on the semiconductor substrate. A charge storing layer is formed on the tunnel insulating layer. An interlayer insulating layer is formed on the charge storing layer and a gate conductive layer is formed on the interlayer insulating layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the figures:

FIGS. 3A through 3E are cross-sectional views illustrating a method of fabricating a nonvolatile memory device according to some embodiments of the present invention;

FIGS. 4A through 4E are cross-sectional views illustrating a method of fabricating a nonvolatile memory device according to other embodiments of the present invention.

DETAILED DESCRIPTION OF EMBODIMENTS OF THE INVENTION

Figure 1:
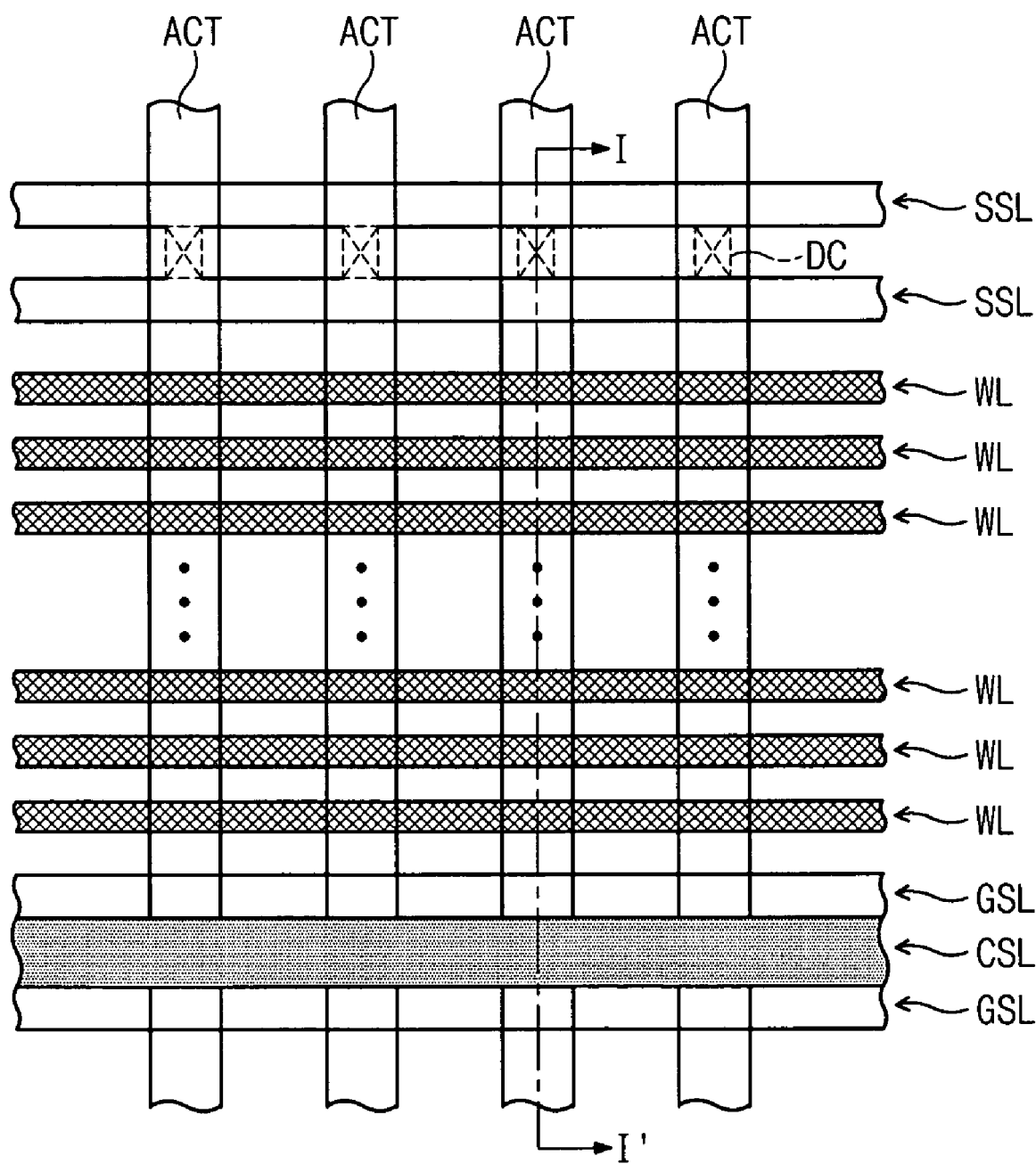
FIG. 1 is a plan view of a NAND flash memory device according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
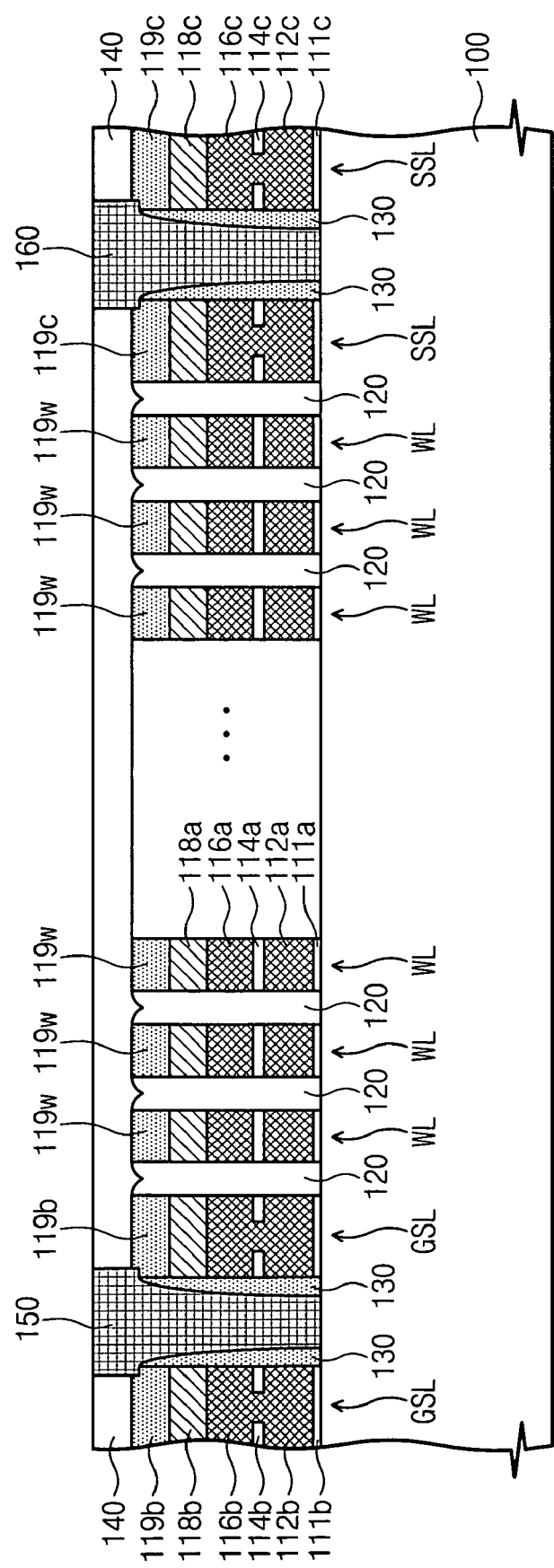
FIG. 2 is a cross-sectional view taken along a line I-I' of FIG. 1.

A nonvolatile memory device according to some embodiments of the present invention will now be described with reference to FIGS. 1 and 2. More particularly, FIG. 1 is a plan view of a NAND flash memory device according to some embodiments of the present invention and FIG. 2 is a cross-sectional view taken along a line I-I' of FIG. 1. As shown in FIG. 1, active regions ACT are arranged on an integrated circuit (semiconductor) substrate extending in parallel in a first direction. Wordlines WL are shown extending in a second direction crossing the active regions ACT. Ground select lines ground select lines GSL are shown arranged (positioned) on one side of the wordlines WL and extending in the second direction. String select lines SSL are arranged on the other (opposite) side of the wordlines WL. When the nonvolatile memory device is scaled down (more highly integrated), the interval (spacing) between the string select lines SSL and the interval (spacing) between the ground select lines GSL may decrease. A common source line CSL is shown self-aligned between the ground select lines GSL, and a bitline contact DC is shown self-aligned between the string select lines SSL.

Referring now to FIG. 2, the wordlines WL are arranged on an integrated circuit (semiconductor) substrate 100. The ground select lines GSL are located on one side of the plurality of wordlines WL and the string select lines SSL are located on the other (opposite) side of the plurality of wordlines WLs. The wordlines WL, the ground select lines GSL and the string select lines SSL in the illustrate embodiments include stacked tunnel insulating patterns 111a, 111b and 111c, charge storage patterns 112a, 112b and 112c, interlayer insulating patterns 114a, 114b and 114c, gate conductive patterns 116a, 116b and 116c, metal silicide patterns 118a, 118b and 118c, and hard mask patterns 119w, 119b and 119c, respectively. The interlayer insulating patterns 114b and 114c of the string select lines SSL and the ground select lines GSL may include a butting contact that connects the charge storage patterns 112b and 112c and the gate conductive patterns 116b and 116c, respectively, as shown in FIG. 2.

First spacers 120 are disposed between the wordlines WL and between the wordlines WL adjacent to the ground select lines GSL and the ground select lines GSL and between the wordlines WL adjacent to the string select lines SSL and the string select lines SSL. The first spacers 120 may not contain nitrogen. The first spacers 120 may have a lower dielectric permittivity than second spacers 130, which will be described below. The first spacers 120 in some embodiments contain a silicon oxide layer. The use of the first spacers 120 containing the silicon oxide layer may allow reduction or even removal of a charge trap site therein and a reduction of the interference between adjacent ones of the wordlines WL.

The second spacers 130 are shown disposed on the sidewalls between the ground select lines GSL and between the string select lines SSL. The second spacers 130 may include a silicon nitride layer. A re-oxidized layer may be interposed between the second spacer 130 and the ground select line GSL, and between the second spacer 130 and the string select line SSL. A pad oxide layer may be disposed on the re-oxidized layer. The pad oxide layer may be interposed between the second spacer 130 and the re-oxidized layer. The re-oxidized layer may include a thermal oxide layer that is formed by a re-oxidation process to reduce or remove etch damage of a gate insulating layer in a preceding process. The pad oxide layer may serve to reduce a stress caused by a difference between the thermal expansion coefficients of the semiconductor substrate 100 and the second spacer 130.

Each of the illustrated ground select lines GSL includes in the embodiments of FIG. 2 is shown as having a hard mask layer 119b on the top layer thereof. Likewise, each of the string select lines SSL in the embodiments of FIG. 2 has a hard mask layer 119c on the top layer thereof. An insulating layer 140 is disposed to cover the wordlines WL, the ground select lines GSL, and the string select lines SSL.

A common source line 150 extends through the insulating layer 140 and contacts the second spacer 130 between the ground select lines GSL. The second spacer 130 may have a lower etch selectivity than the insulating layer 140. The hard mask patterns 119b may have a lower etch selectivity than the insulating layer 140. Accordingly, the common source line 150 can be self-aligned between the hard mask patterns 119b located in the top layers of the ground select lines GSL.

A bitline contact 160 extends through the insulating layer 140 and contacts the second spacer 130 between the string select lines SSL. Because the hard mask patterns 119b and the second spacer 130 have a lower etch selectivity than the insulating layer 140, the bitline contact 160 can be self-aligned between the hard mask patterns 119c located in the top layer of the string select lines SSL. As the common source line 150 and the bitline contact 160 may be self-aligned, it may be easier to increase integration density for the device structure shown in FIG. 2.

Figure 3A:
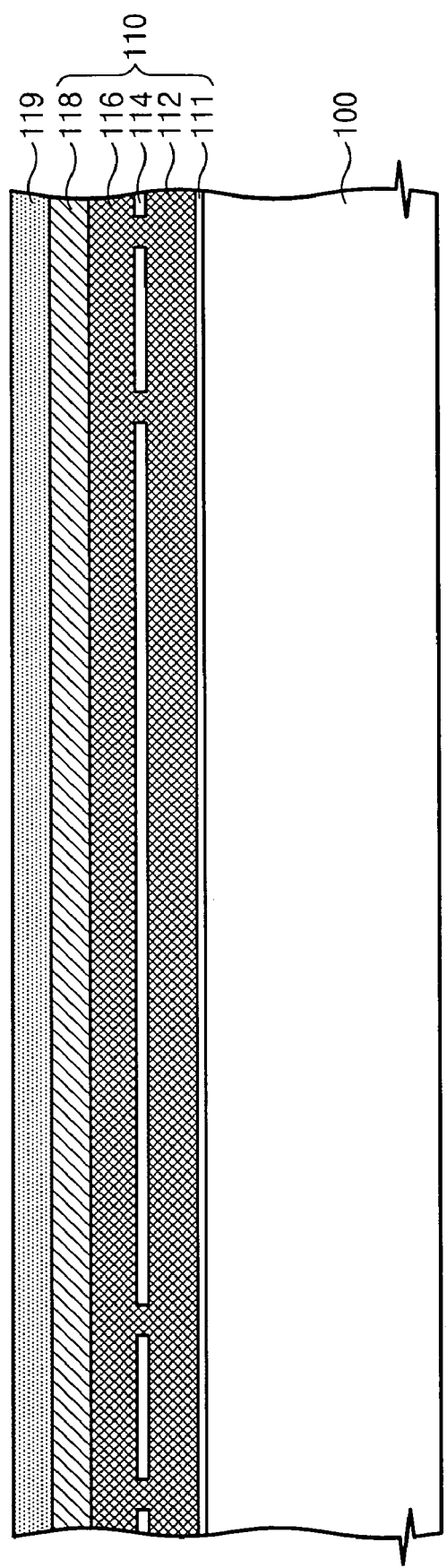

FIGS. 3A through 3E are cross-sectional views illustrating a method of fabricating a nonvolatile memory device according to some embodiments of the present invention. Referring first to FIG. 3A, a tunneling insulating layer 111 is formed on a semiconductor (integrated circuit) substrate 100. The tunneling insulating layer 111 may include a silicon oxide layer, which may be formed by thermal oxidation. A charge storage layer 112 is formed on the tunneling insulating layer 111. For example, the charge storage layer 112 may include a floating gate layer and/or a charge trap layer (and/or a silicon nitride layer). The charge storage layer 112 may include a polysilicon layer that is formed by chemical vapor deposition (CVD).

An interlayer insulating layer 114 is formed on the charge storage layer 112. The interlayer insulating layer 114 may include an oxide-nitride-oxide (ONO) layer, which may be formed by CVD. In a region for ground select lines and string select lines, the interlayer insulating layer 114 may have a butting contact connecting the charge storage layer 112 and a gate conductive layer 116. The gate conductive layer 116 is shown formed on the interlayer insulating layer 114. The gate conductive layer 116 may include a polysilicon layer, which may be formed by CVD. A metal silicide layer 118 is formed on the gate conductive layer 116. The metal silicide layer 118 may include a tungsten silicide layer. Thus, as illustrated in FIG. 3A, a gate layer 110 includes the tunneling insulating layer 111, the charge storage layer 112, the interlayer insulating layer 114, the gate conductive layer 116, and the metal silicide layer 118.

A hard mask layer 119 is formed on the metal silicide layer 118. The hard mask layer 119 may include a silicon nitride layer, which may be formed by CVD. Before forming the hard mask layer 119, a silicon oxide layer (not illustrated) may be further formed on the metal silicide layer 118 by, for example, plasma-enhanced CVD (PECVD).

Referring to FIG. 3B, a photoresist pattern (not illustrated) is formed on the hard mask layer 119 to expose a region for the wordlines WL. Using the photoresist pattern as an etch mask, the hard mask layer 119 is etched to form hard mask patterns 119a and 119w. Using the hard mask patterns 119a and 119w as an etch mask, an etching process is performed to form the wordlines WL and the gate patterns 110a in the adjacent select line regions. Each of the wordlines WL and the gate patterns 110a in the adjacent select line regions may include a tunneling insulating pattern 111a, a charge storage pattern 112a, an interlayer insulating pattern 114a, a gate conductive pattern 116a, and a metal silicide pattern 118a. After forming the wordlines WL, a re-oxidation process may be performed to remove an etch damage caused to the edge of the tunneling insulating pattern 111a.

Referring to FIG. 3C, first spacers 120 are formed between the wordlines WL and between the wordlines WL and the gate patterns 110a in the adjacent select line regions. Forming the first spacers 120 may include: forming a silicon oxide layer that covers the wordlines WL and the gate patterns 110a in the adjacent select line regions; and performing an anisotropic etching process on the silicon oxide layer. Because the first spacers 120 are formed of the silicon oxide layer, the risk of introduction of a charge trap site adjacent to the wordlines WL can be reduced.

Referring to FIG. 3D, a photoresist pattern (not illustrated) is formed to expose regions for ground select lines GSLs and string select lines SSLs in the adjacent select line regions. Using the photoresist pattern as an etch mask, an etching process is performed to form hard mask patterns 119b and 119c. Using the hard mask patterns 119b and 119c as an etch mask, the gate patterns 110a in the adjacent select line regions are patterned to form ground select lines GSL on one side of the wordlines WL and string select lines SSL on the other side of the wordlines WL.

The ground select lines GSL may include a tunneling insulating pattern 111b, a charge storage pattern 112b, an interlayer insulating pattern 114b, a gate conductive pattern 116b, and a metal silicide pattern 118b. Likewise, the string select lines SSL may include a tunneling insulating pattern 111c, a charge storage pattern 112c, an interlayer insulating pattern 114b, a gate conductive pattern 116c, and a metal silicide pattern 118c. Second spacers 130 are formed on sidewalls between the ground select lines GSL and the string select lines SSL. The forming of the second spacers 130 may include: forming a silicon nitride layer that covers the ground select lines GSL and the string select lines SSL; and performing an anisotropic etching process on the silicon nitride layer.

Figure 3E:
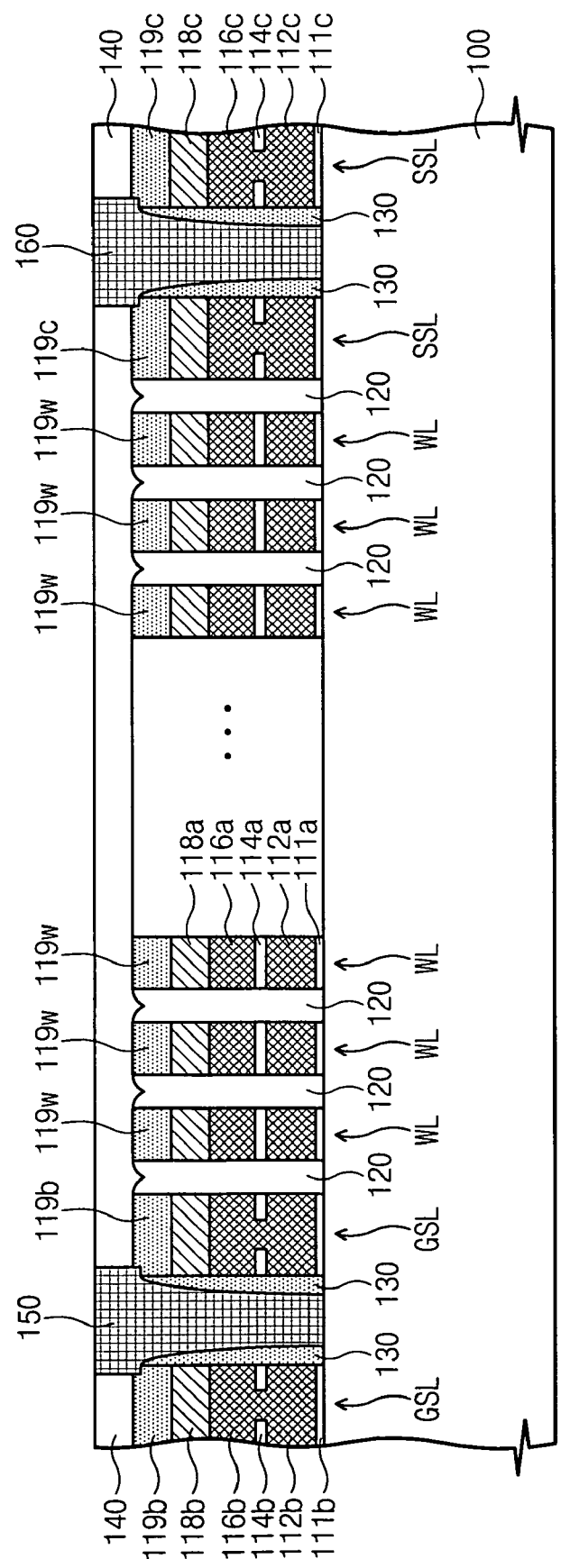

Referring to FIG. 3E, an insulating layer is formed that covers the wordlines WL, the ground select lines GSL and the string select lines SSL. The insulating layer 140 may include a silicon oxide layer, which may be formed by CVD. A common source line 150 is formed extending through the insulating layer 140 that contacts the second spacers 130 between the ground select lines GSL. The common source line 150 may be formed to be self-aligned between the hard mask patterns 119b located in the top layers of the ground select lines GSL. A bitline contact 160 is formed extending through the insulating layer 140 that contacts the second spacers 130 between the string select lines SSL. The bitline contact 160 may be formed to be self-aligned between the hard mask patterns 119c located in the top layers of the string select lines SSL. As the common source line 150 may be self-aligned between the hard mask patterns 119b and the bitline contact 160 may be self-aligned between the hard mask patterns 119c, the nonvolatile memory device may be more readily scaled down to provide a greater integration density.

Figure 4B:
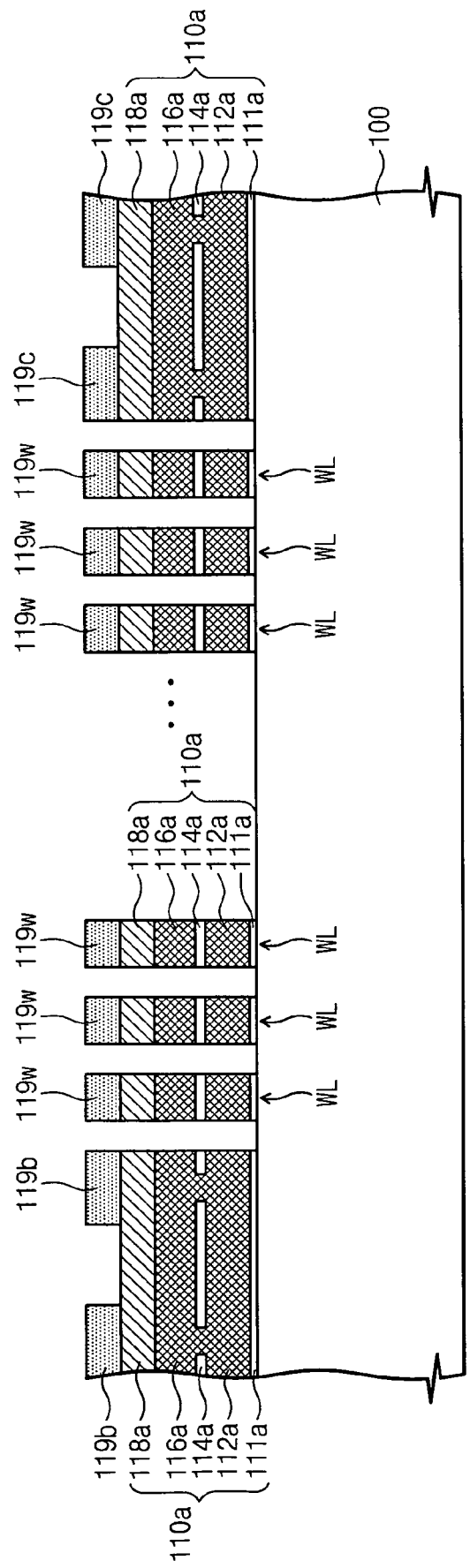

FIGS. 4A through 4E are cross-sectional views illustrating a method of fabricating a nonvolatile memory device according to further embodiments of the present invention. Referring to FIG. 4A, a gate layer 110 may be formed on a semiconductor substrate 100 substantially as described previously with reference to FIG. 3A. Hard mask patterns 119b, 119c and 119w are formed on the gate layer 110. The hard mask patterns 119b, 119c and 119w define regions for wordlines WL, ground select lines GSL and string select lines SSL.

Referring to FIG. 4B, a photoresist pattern (not illustrated) is formed to expose a region, including the hard mask patterns 119w, for the wordlines WL. Using the hard mask patterns 119w as a mask, the gate layer 110 is patterned to form wordlines WL and gate patterns 110a in adjacent select line regions. Each of the wordlines WL and the gate patterns 110a in the adjacent regions may include a tunneling insulating pattern 111a, a charge storage pattern 112a, an interlayer insulating pattern 114a, a gate conductive pattern 116a, and a metal silicide pattern 118a.

Referring to FIG. 4C, first spacers 120 are formed between the wordlines WL and between the wordlines WL and the gate patterns 110a in the adjacent regions. Forming the first spacers 120 may include: forming a silicon oxide layer that covers the wordlines WL and the gate patterns 110a in the adjacent regions; and performing an anisotropic etching process on the silicon oxide layer.

Figure 4D:
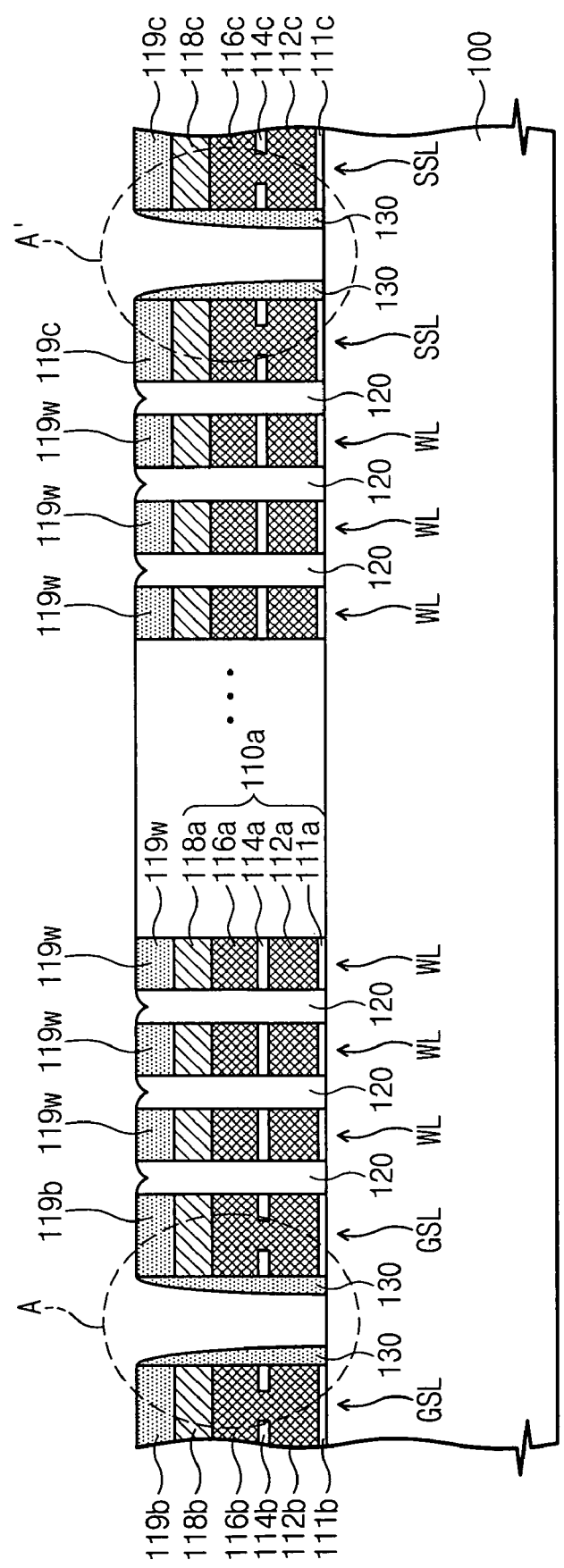

Referring to FIG. 4D, a photoresist pattern (not illustrated) is formed that exposes the adjacent regions for forming the ground select lines GSL and string select lines SSL. Using the hard mask patterns 119b and 119c as an etch mask, an etching process is performed to form the ground select lines GSL and the string select lines SSL. Each of the ground select lines GSL may include a tunneling insulating pattern 111b, a charge storage pattern 112b, an interlayer insulating pattern 114b, a gate conductive pattern 116b, and a metal silicide pattern 118b. Likewise, each of the string select lines SSL may include a tunneling insulating pattern 111c, a charge storage pattern 112c, an interlayer insulating pattern 114c, a gate conductive pattern 116c, and a metal silicide pattern 118c.

Figure 4E:
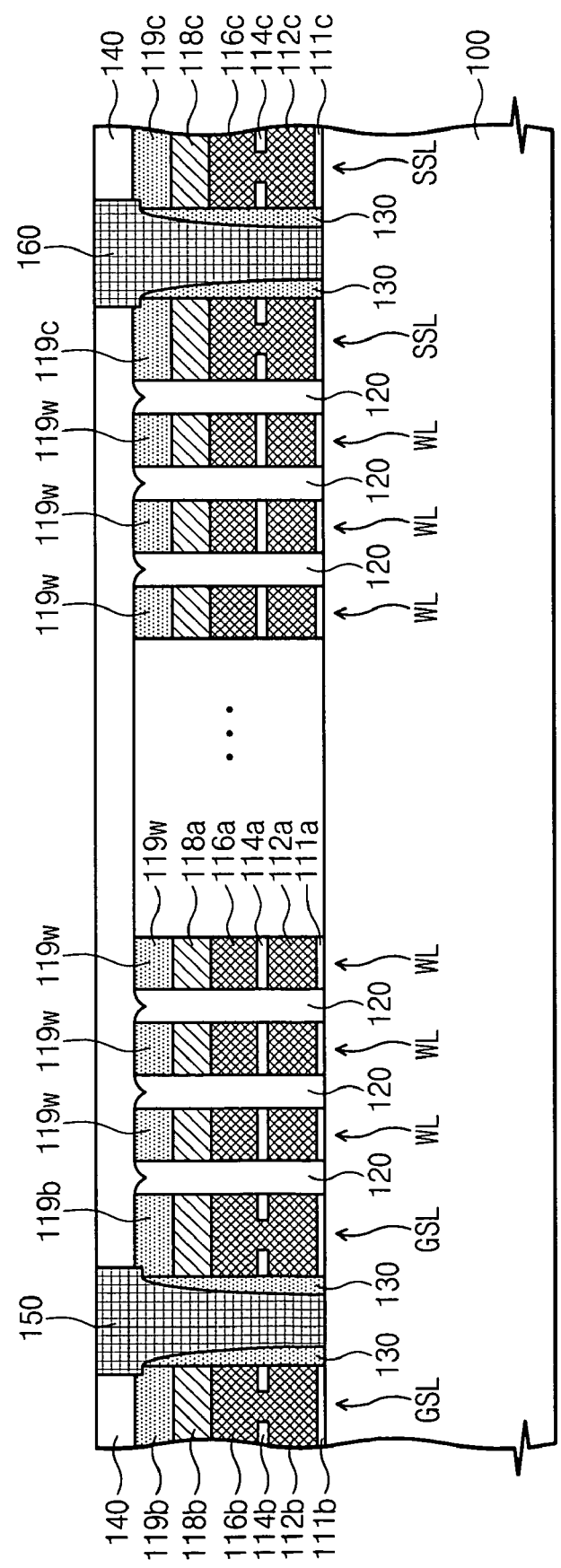

Referring to FIG. 4E, an insulating layer 140 is formed that covers the ground select lines GSL and the string select lines SSL. The insulating layer 140 may include a silicon oxide layer, which may be formed by CVD. A common source line 150 is formed extending through the insulating layer 140 that is self-aligned between the hard mask patterns 119b located in the top layer of the ground select lines GSL. A bitline contact 160 is formed extending through the insulating layer 140 that is self-aligned between the hard mask patterns 119c located in the top layer of the string select lines SSL. According to some embodiments of the present invention, the hard mask patterns 119b, 119c and 119w may be simultaneously formed, which may make it possible to substantially limit or even prevent any misalignment between the wordlines WL and the ground select lines GSL or the string select lines SSL.

Figure 5:
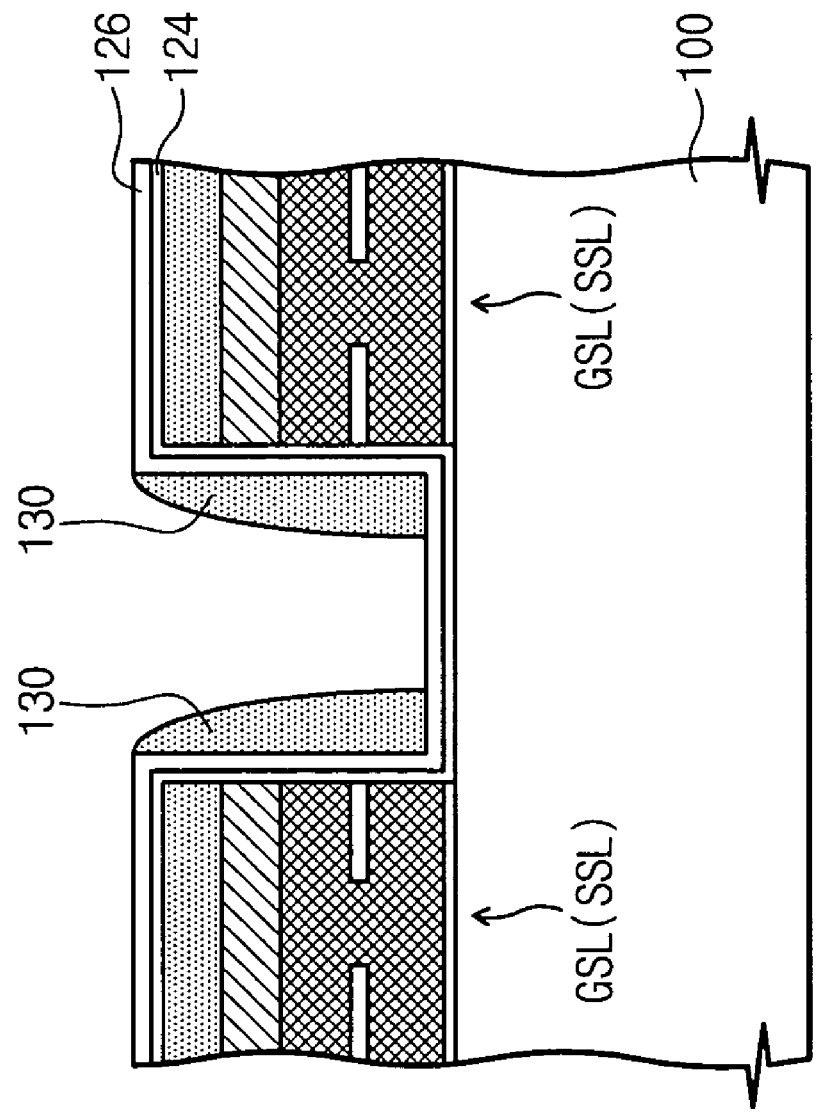
FIG. 5 is a partial cross-sectional view of a region identified as sections A and A' in FIGS. 3D and 4D.

FIG. 5 is a partial cross-sectional view of the regions indicated as sections A and A' in FIGS. 3D and 4D. Referring to FIGS. 3D, 4D and 5, after forming the ground select lines GSL, a re-oxidation process may be performed to remove an etch damage of the edge of the gate insulating layer, which damage may occur during forming of the ground select lines GSL. The re-oxidation process forms a re-oxidation layer 124. Forming the second spacers 130 may include forming a silicon nitride layer that covers the ground select lines GSL and/or the string select lines SSL. A stress may be introduced during the forming process due to a difference between the thermal expansion coefficients of the semiconductor substrate 100 and the silicon nitride layer. A pad oxide layer 126 may be formed on the re-oxidation layer 124 in order to limit or prevent the stress between the semiconductor substrate 100 and the silicon nitride layer of the second spacers 130. The pad oxide layer 126 may include be middle temperature oxide layer, which may be is formed by CVD.

As described above, according to some embodiments of the present invention, the spacer between the wordlines WL is formed of a silicon oxide layer. As such, formation of a charge trap site can be reduced/avoided and the interference between the adjacent wordlines WL can be reduced.

In addition, the spacers on the sidewalls of the ground select lines GSL and the string select lines SSL in some embodiments are formed of a silicon nitride layer. As such, the common source line and the bitline contact can be formed in a self-aligned fashion, which may allow scaling down the nonvolatile memory device to provide a more highly integrated device.

According to the other embodiments of the present invention, the hard mask patterns defining the regions for the wordlines WL, the ground select lines GSL and the string select lines SSL are formed in advance, which may make it possible to limit or even prevent a misalignment between the wordlines WL and the ground select lines GSL and/or the string select lines SSL.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A memory device comprising:
a semiconductor substrate;
a plurality of wordlines on the semiconductor substrate;
a ground select line on the semiconductor substrate on one side of the wordlines;
a string select line on the semiconductor substrate on the other side of the wordlines, wherein the wordlines extend between the ground select line and the string select line wherein the both sides of each of the wordlines, the ground select line and the string select line have a pair of spacers selected from first and second spacers;
the first spacer being disposed between the wordlines, between a first side of the ground select line and the wordline adjacent to the ground select line and between a first side of the string select line and the wordline adjacent to the string select line;
the second spacer disposed on a second side of the ground select line and a second side of the string select line, wherein the first sides are the sides of the string or ground select line that face the adjacent wordline and the second spacer is opposite the first spacer,
a common source line formed between the second spacers of two adjacent ground select lines; and
a bitline contact formed between the second spacers of two adjacent string select lines,
wherein the second spacer is formed of a different material from that of the first spacer, wherein the second spacer is absent from between the wordlines and the first spacer is absent from the second side of both the ground select line and the string select line.

2. The memory device of claim 1, wherein the memory device comprises a nonvolatile memory device and wherein the memory device comprises a pair of ground select lines located next to each other and a pair of string select lines located next to each other and
wherein the second spacers are disposed on facing sidewalls between the ground select lines and on facing sidewalls between the string select lines, respectively.

3. The memory device of claim 2, wherein the first spacer has a lower dielectric permittivity than the second spacer.

4. The memory device of claim 2, wherein the first spacer is substantially free of nitrogen.

5. The memory device of claim 2, wherein the first spacer comprises a silicon oxide layer and the second spacer comprises a silicon nitride layer.

6. The memory device of claim 2, wherein the second spacers has a lower etch selectivity than the first spacer.

7. The memory device of claim 2, wherein each of the ground select lines and the string select lines includes a hard mask pattern in a top layer thereof.

8. The memory device of claim 7, wherein the hard mask pattern has a lower etch selectivity than an oxide layer.

9. The memory device of claim 7, wherein the second spacers and the hard mask pattern comprise a nitride layer.

10. The memory device of claim 9, wherein the common source line and the bitline contact are self-aligned between the hard mask patterns.

11. The memory device of claim 2, further comprising:
a re-oxidation layer on the ground select lines and the string select lines; and
a pad oxide layer on the re-oxidation layer, wherein the re-oxidation layer and the pad oxide layer are interposed between the second spacers and the ground select lines and between the second spacers and the string select lines, respectively.

12. The memory device of claim 2, wherein the ground select lines, the string select lines and/or the wordlines comprise:
a tunnel insulating layer on the semiconductor substrate;
a charge storing layer on the tunnel insulating layer;
an interlayer insulating layer on the charge storing layer; and
a gate conductive layer on the interlayer insulating layer.

13. The memory device of claim 2, wherein the ground select lines, the string select lines and the wordlines each comprise:
a tunnel insulating layer on the semiconductor substrate;
a charge storing layer on the tunnel insulating layer;
an interlayer insulating layer on the charge storing layer; and
a gate conductive layer on the interlayer insulating layer.

14. The memory device of claim 1, wherein the common source line contacts the second spacers of the two adjacent ground select lines; and
the bitline contact contacts the second spacers of the two adjacent string select lines.

15. The memory device of claim 1, wherein the second spacer is a single-layer spacer between the ground select lines and the common source line, and between the string select lines and the bitline contact.

16. A memory device comprising:

a semiconductor substrate;

a plurality of wordlines on the semiconductor substrate;

a ground select line on the semiconductor substrate on a first side of the wordlines;

a string select line on the semiconductor substrate on a second side of the wordlines, wherein the wordlines extend between the ground select line and the string select line;

first spacers disposed between the wordlines, between the ground select line and an adjacent one of the wordlines and between the string select line and an adjacent one of the wordlines; and second spacers disposed on sidewalls of the ground select line and the string select line displaced from the first spacers, wherein the second spacers are a different material than the first spacers, wherein the second spacers are disposed to expose the first spacers wherein the second spacers are absent from between the wordlines and the first spacers are absent from a second side of both the ground select line and the string select line.

\* \* \* \* \*